United States Patent
Jhon et al.

(10) Patent No.: US 9,543,179 B2
(45) Date of Patent: Jan. 10, 2017

(54) LOAD PORT MODULE

(71) Applicant: SAMSUNG ELECTRONICS CO., LTD., Suwon-si, Gyeonggi-do (KR)

(72) Inventors: Chol-Min Jhon, Seoul (KR); Ho-Hyung Jung, Hwaseong-si (KR); Sung-Sick An, Yongin-si (KR); Yong-Chul Lee, Hwaseong-si (KR); Mi-Jung Jeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 353 days.

(21) Appl. No.: 14/193,394

(22) Filed: Feb. 28, 2014

(65) Prior Publication Data
US 2014/0325772 A1 Nov. 6, 2014

(30) Foreign Application Priority Data
May 6, 2013 (KR) .................. 10-2013-0050700

(51) Int. Cl.
*H01L 21/677* (2006.01)
*H01L 21/67* (2006.01)

(52) U.S. Cl.
CPC ... *H01L 21/67772* (2013.01); *H01L 21/67028* (2013.01); *H01L 21/67253* (2013.01); *H01L 21/67775* (2013.01)

(58) Field of Classification Search
CPC .................. H01L 21/67772; H01L 21/67028; H01L 21/67253; H01L 21/67775
USPC ........................... 414/217; 15/97.1, 319, 301
See application file for complete search history.

(56) References Cited

U.S. PATENT DOCUMENTS

| | | | | |
|---|---|---|---|---|
| 6,120,229 A | * | 9/2000 | Hofmeister | H01L 21/67772 414/217 |
| 6,867,153 B2 | * | 3/2005 | Tokunaga | H01L 21/67017 141/63 |
| 8,267,633 B2 | * | 9/2012 | Obikane | H01L 21/67772 414/217 |
| 8,302,637 B2 | | 11/2012 | Okabe et al. | |
| 2005/0111943 A1 | * | 5/2005 | Otaguro | H01L 21/67772 414/411 |
| 2006/0245849 A1 | * | 11/2006 | Yokoyama | H01L 21/67772 414/217 |
| 2006/0285944 A1 | * | 12/2006 | Evans | H01L 21/67781 414/217 |
| 2009/0035100 A1 | * | 2/2009 | Okabe | H01L 21/67772 414/217 |

(Continued)

FOREIGN PATENT DOCUMENTS

KR 10-2004-0069991 A 8/2004
KR 10-2009-0013092 A 2/2009
(Continued)

*Primary Examiner* — Joseph J Hail
*Assistant Examiner* — Henry Hong
(74) *Attorney, Agent, or Firm* — Lee & Morse, P.C.

(57) ABSTRACT

A load port module includes a plate to support at least one substrate, a sensor to detect foreign matter at a predetermined location, and a cleaner to remove the foreign matter at the predetermined location when the foreign matter is detected by the sensor. The cleaner removes the foreign matter at the predetermined location in synchronism with movement of the plate. A mover to move the plate continues to operate after detection of the foreign matter by the sensor and removal of the foreign matter by the cleaner.

10 Claims, 8 Drawing Sheets

(56) References Cited

U.S. PATENT DOCUMENTS

| | | | |
|---|---|---|---|
| 2009/0129897 A1* | 5/2009 | Babbs | H01L 21/67201 |
| | | | 414/217 |
| 2009/0142170 A1 | 6/2009 | Natsume | |
| 2009/0169342 A1* | 7/2009 | Yoshimura | H01L 21/67772 |
| | | | 414/217 |
| 2009/0317214 A1* | 12/2009 | Hsiao | H01L 21/67017 |
| | | | 414/217 |
| 2011/0032505 A1* | 2/2011 | Lansbergen | G03F 7/70741 |
| | | | 355/73 |
| 2011/0094749 A1 | 4/2011 | Richards et al. | |

FOREIGN PATENT DOCUMENTS

| | | |
|---|---|---|
| KR | 10-2009-0056878 A | 6/2009 |
| KR | 2012-0027010 A | 3/2012 |
| KR | 10-2012-0056484 A | 6/2012 |

\* cited by examiner

LOAD PORT MODULE

CROSS-REFERENCE TO RELATED APPLICATION

Korean Patent Application No. 10-2013-0050700, filed on May 6, 2013, and entitled, "Load Port Module and Method Of Loading A Substrate Into A Process Chamber Using The Same," is incorporated by reference herein in its entirety.

BACKGROUND

1. Field

One or more embodiments described herein relate to a processing chamber for a semiconductor device.

2. Description of the Related Art

Semiconductor devices are usually manufactured by performing a series of unit processes. The unit processes may be performed in one or more process chambers. Therefore, a semiconductor wafer containing the devices is required to be loaded or otherwise transferred into the chamber(s).

According to one technique, the wafer is loaded into a chamber using a wafer cassette and load port module. The cassette and module are usually sealed during transfer to prevent contamination. A plurality of wafers may be stacked in an inner space of the cassette such as a front opening unified pod (FOUP). The door of the cassette may be closed to seal of the inner space of the cassette. Then, the cassette may be moved to a load port of a chamber or other processing apparatus. The door of the cassette may be opened while the inner space is sealed.

When the cassette is positioned on the load port module, particles are usually generated as a result of contact between the cassette and module. The particles may be distributed across the surface of the module, thereby introducing contaminants. The load port module may include a status sensor to detect these particles. Upon detection, the load port module may be stopped to prevent the wafer from being loaded into a next process chamber or other area or apparatus. The load failure of wafers due to these particles (and/or other sources) frequently occurs in proportional to the precision of the status sensor.

When the load port module is stopped, the particles are manually removed from the load port module and the module is re-worked by an operator. This reduces the efficiency of the module and the overall efficiency of the manufacturing process.

SUMMARY

In accordance with one embodiment, a load port module includes a vertical frame having an opening to be closed by an opener for opening a door of a substrate cassette including a plurality of stacked substrates, a stage having a fixed plate that extends outwardly from the vertical frame, and a moving plate movably arranged on the fixed plate to support the substrate cassette, a driver under the stage and having a moving unit to drive the moving plate and opener, a safety sensor on at least one of the vertical frame or the stage around the opening, the safety sensor to generate a stop signal to stop the moving unit when foreign matter is detected around the opening; and a sensor cleaner connected to the driver to automatically remove the foreign matter when the moving plate moves, the moving unit continuing to operate after detection of the foreign matter by the safety sensor and removal of the foreign matter by the sensor cleaner.

The safety sensor may include an optical sensor to generate the stop signal based on an optical signal, and the moving unit includes a pneumatic operator to effect linear motion using first compressed air.

The sensor cleaner may include a guide tube to guide second compressed air onto the stage and a nozzle connected to the guide tube to direct the second compressed air to the safety sensor.

The optical sensor may include a first light emitter, coupled to the fixed plate adjacent to a first side portion of the moving plate, to generate a first optical signal, a second light emitter, coupled to the fixed plate adjacent to a second side portion opposite to the first side portion of the moving plate, to generate a second optical signal, a light receiver, coupled to the vertical frame along a path of the first optical signal, the light receiver to receive the first optical signal directly from the first light emitter, and a reflector coupled to the vertical frame along a path of the second optical signal facing the light receiver, light receiver to receive the second optical signal indirectly via the reflector, wherein the nozzle includes a first lower nozzle through which the second compressed air is directed to the first light emitter and a second lower nozzle through which the second compressed air is directed to the second light emitter.

The pneumatic operator may include a cylinder through which the first compressed air flows, a piston reciprocating in the cylinder according to the first compressed air, and a piston rod connected to the piston and extending to an exterior of the cylinder; and the guide tube includes a tube body to which the second compressed air may be supplied from the driver, a first branch diverging from the tube body and connected to the first lower nozzle, and a second branch diverging from the tube body and connected to the second lower nozzle.

The nozzle may include a first upper nozzle through which the second compressed air is directed to the light receiver and a second upper nozzle through which the second compressed air may be directed to the reflector; and the guide tube may further include a third branch diverging from the tube body and connected to the first upper nozzle and a fourth branch diverging from the tube body and connected to the second upper nozzle.

The pneumatic operator may include a double-acting pneumatic cylinder, and an inner space of the cylinder may include a first space and a second space, the first compressed air supplied to one of the first or second spaces and air discharged from other one of the first or second spaces. The driver may include a solenoid valve to selectively supply the first compressed air to one of the first p second spaces of the cylinder.

The moving unit may include a first actuator to move the moving plate on the fixed plate in a horizontal direction, and a second actuator to move the opener along the vertical frame in a vertical direction. The driver may include a controller connected to the first and the second actuators and the safety sensor, the controller to control the first and second actuators to stop the moving plate and the opener, respectively, according to the stop signal generated from the safety sensor.

In accordance with another embodiment, a method of loading a substrate includes mounting a substrate cassette onto a moving plate movably arranged on a fixed plate, the fixed plate extending from a vertical frame of a load port module, the vertical frame including an opening to be closed by an opener; and moving the moving plate on the fixed plate toward the vertical frame, wherein moving the moving plate removes foreign matter from a safety sensor which detects the foreign matter on at least one of the fixed plate or the vertical frame around the opening.

Removing the foreign matter may be performed simultaneously with moving the moving plate. Moving the moving plate may be performed by first compressed air supplied by a pneumatic operator, the foreign matter removed by directing second compressed air to the safety sensor, air discharged from the pneumatic operator being pressurized into the second compressed air.

The method may include generating an optical signal from a light emitter coupled to the fixed plate, and receiving the optical signal using a light receiver positioned on the vertical frame, wherein safety sensor includes the light emitter and light receiver and wherein the second compressed air is directed to at least one of the light emitter or the light receiver.

The method may include moving the opener with the door along the vertical frame in a vertical direction, to separate the door from the substrate cassette and to provide access to the substrate cassette; extracting the substrate from the substrate cassette through the opening; and loading the substrate into a process chamber positioned opposite to the vertical frame.

In accordance with another embodiment, a load port module includes a plate to support at least one substrate; a sensor to detect foreign matter at a predetermined location; and a cleaner to remove the foreign matter at the predetermined location when the foreign matter is detected by the sensor, wherein the cleaner removes the foreign matter at the predetermined location in synchronism with movement of the plate.

The load port module may include a mover to move the plate, wherein the mover may continue to operate after detection of the foreign matter by the sensor and removal of the foreign matter by the cleaner. The plate may support a substrate cassette which includes the at least one substrate. The cleaner may direct a flow of air to remove the foreign matter from the predetermined location. The predetermined location may be a location which receives the foreign matter based on movement of a cassette onto the plate, the cassette including a substrate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. In accordance with one example embodiment, the terms wafer and substrate may refer to a plane or structure including areas corresponding to one or more semiconductor devices.

Referring to FIGS. 1 to 4, one embodiment of a load port module may include a vertical frame 100, a stage 200, a driver 300, a safety sensor 400, and a sensor cleaner 500. The vertical frame 100 includes an opening 111 which may be closed by an opener 120. The opener 120 may opening a door 12 of a substrate cassette 10, in which a plurality of substrates (or wafers) to be processed may be stacked.

The stage 200 has a fixed plate 210 that may be extended outwardly from the vertical frame 100 and a moving plate 220 that may be movably arranged on the fixed plate 210. The moving plate 220 may support the substrate cassette 10.

The driver 300 is positioned under stage 200 and has a moving unit 310 for driving the moving plate 220 and opener 120.

The safety sensor 400 is arranged on at least one of the vertical frame 100 or the stage 200 and generates stop signals for stopping the moving unit 310. The safety sensor 400 may generate a stop signal when foreign matter is detected around the opening.

The sensor cleaner 500 is connected to driver 300 and automatically removes the foreign matter when moving plate 220 moves. Through this cleaning operation of the sensor cleaner, an operation for stopping moving unit 310 for cleaning (e.g., manually) may be prevented.

In an example embodiment, the vertical frame 100 may be provided as one of a sidewall of a substrate transfer module from which the substrate may be transferred into a process chamber. That is, the substrate may be transferred into the transfer module from substrate cassette 10 (e.g., a wafer cassette) through a first gate of the vertical frame 100. The substrate may be loaded to the process chamber from the transfer module through a second gate communicating with the process chamber. Therefore, the vertical frame 100 may include a front sidewall 110 facing substrate cassette 10 and an opening 111 corresponding to the gate penetrating through the front sidewall 110. The substrate cassette 10 may be inserted into opening 111 and combined with an opener 120 for opening the door of substrate cassette 10.

The substrate transfer module may include an interface module such as an EFEM (equipment front end module) in which a robot arm for transferring the substrate may be positioned. The substrate transfer module may be controlled based on a predetermined degree or condition of cleanliness. In one embodiment, the substrate transfer module may be defined by vertical frame 100 and another frame opposite to vertical frame 100 and adjacent to the process chamber. For example, the substrate may be transferred to the EFEM from substrate cassette 10 and may be loaded into the process chamber from the EFEM by the robot arm in the EFEM.

Figure 4:
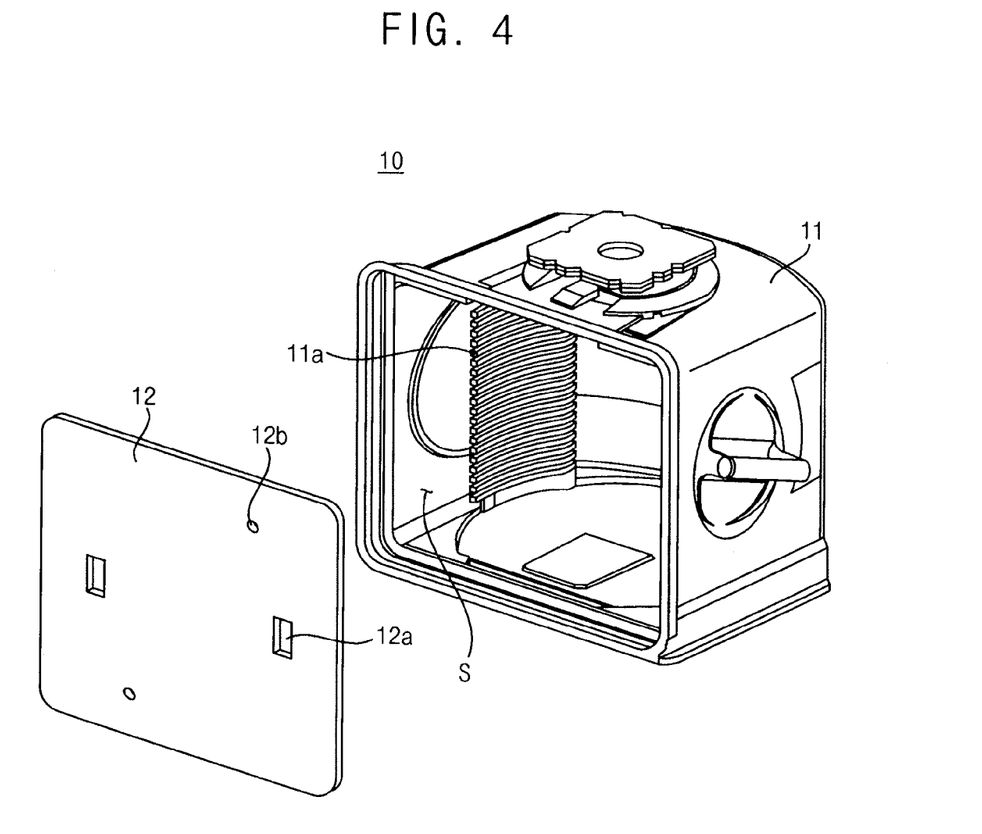
FIG. 4 illustrates an example of a substrate cassette on the load port module.

As shown in FIG. 4, the substrate cassette 10 may include a body 11 having an inner space S, a plurality of slots 11*a* therein, an opening through which inner space S may be accessed, and a door 12 for closing the opening to thereby separate or seal off the inner space from surroundings. A plurality of the substrates may be stacked in the body 11 and supported by respective pairs of slots 11*a*, positioned at opposing inner sidewalls of body 11. The door 12 may be tightly fit into the opening of the body 11. Thus, inner space S of body 11 may be sealed. For example, substrate cassette 10 may include a FOUP (front opening unified pod). Further, a plurality of grooves 12*a* and 12*b* may be arranged on door 12. The opener 120 may be combined with or otherwise coupled to door 12 of the substrate 10 through grooves 12*a* and 12*b*.

The opener 120 may have a shape corresponding to opening 111 of front sidewall 110. The inside of the substrate transfer module may be separated from the outside thereof in which substrate cassette 10 may be positioned. A latch key 121 and an absorption pad 122 may be arranged on an outer surface of the opener 120. The latch key 121 may be inserted into first groove 12*a* of door 12, and thus opener 120 and door 12 may be combined with each other. The absorption pad 122 may be inserted into the second groove 12*b* of door 12, and a vacuum pressure may be applied to door 12 by the absorption pad 122. Therefore, door 12 may be fixed to opener 120 by vacuum absorption.

A slide bar may optionally be connected to an inner surface of opener 120. The slide bar may move along a vertical direction of vertical frame 100, and thus opener 120 may move vertically by the slide bar. That is, when opener 120 moves downwards by the slide bar along front sidewall 110, opening 111 of front sidewall 110 may be open. Particularly, door 12 of the POUP may also move downwards together with opener 120. As a result, inner space S of substrate cassette 10 may communicate with the inside of the EFEM.

A display unit 130 may be arranged on the front sidewall 110, for example, above opening 111. The display unit 130 may visually display various types of information, including information indicative of misalignment between substrate cassette 10 and stage 200 and/or information of ducting failures between substrate cassette 10 and opener 120.

The stage 200 may extend outwardly from front sidewall 110 below opening 111. The substrate cassette 10 may be mounted on stage 200. One or more sensors for detecting mounting failures of substrate cassette 10 may be arranged on and/or over stage 200. Accordingly, stage 200 may be arranged at an exterior of the substrate transfer module. The substrate cassette 10 on stage 200 may be combined with the outer surface of opener 120.

The stage 200 may include the fixed plate 210 that may be secured to the front sidewall 110 and the moving plate 220 that may be movably positioned on the fixed plate 210. The substrate cassette 10 may be positioned on the moving plate 220, and thus the substrate cassette 10 may move along the fix plate according to the movement of the moving plate 220.

For example, moving plate 220 may include a plurality of securing protrusions 221*a*, 221*b*, and 221*c* for securing substrate cassette 10. A plurality of corresponding securing grooves may be arranged on a bottom of substrate cassette 10. The substrate cassette 10 may be secured to moving plate 220 by inserting securing protrusions 221*a*, 221*b* and 221*c* into the securing grooves.

The driver 300 may be arranged under stage 200 and moving unit 310 for moving plate 220, and opener 120 may be arranged in driver 300. In addition, safety sensor 400 and sensor cleaner 500 may be provided on/over stage 200. The safety sensor 400 may generate stop signals for stopping moving unit 310 when detecting particles, contaminants, and/or other types of foreign matter around opening 111 of the front sidewall 110. The sensor cleaner 500 may automatically remove the foreign matter from safety sensor 400 when moving plate 220 moves, thereby preventing moving unit 310 from having to stop in order to allow for removal of the foreign matter.

A housing 301 may be provided under stage 200 and driver 300 having various driving units. In one example embodiment, moving unit 310 may be arranged in a lower space defined by stage 200, a lower portion of front sidewall 110, and housing 301.

Figure 1:
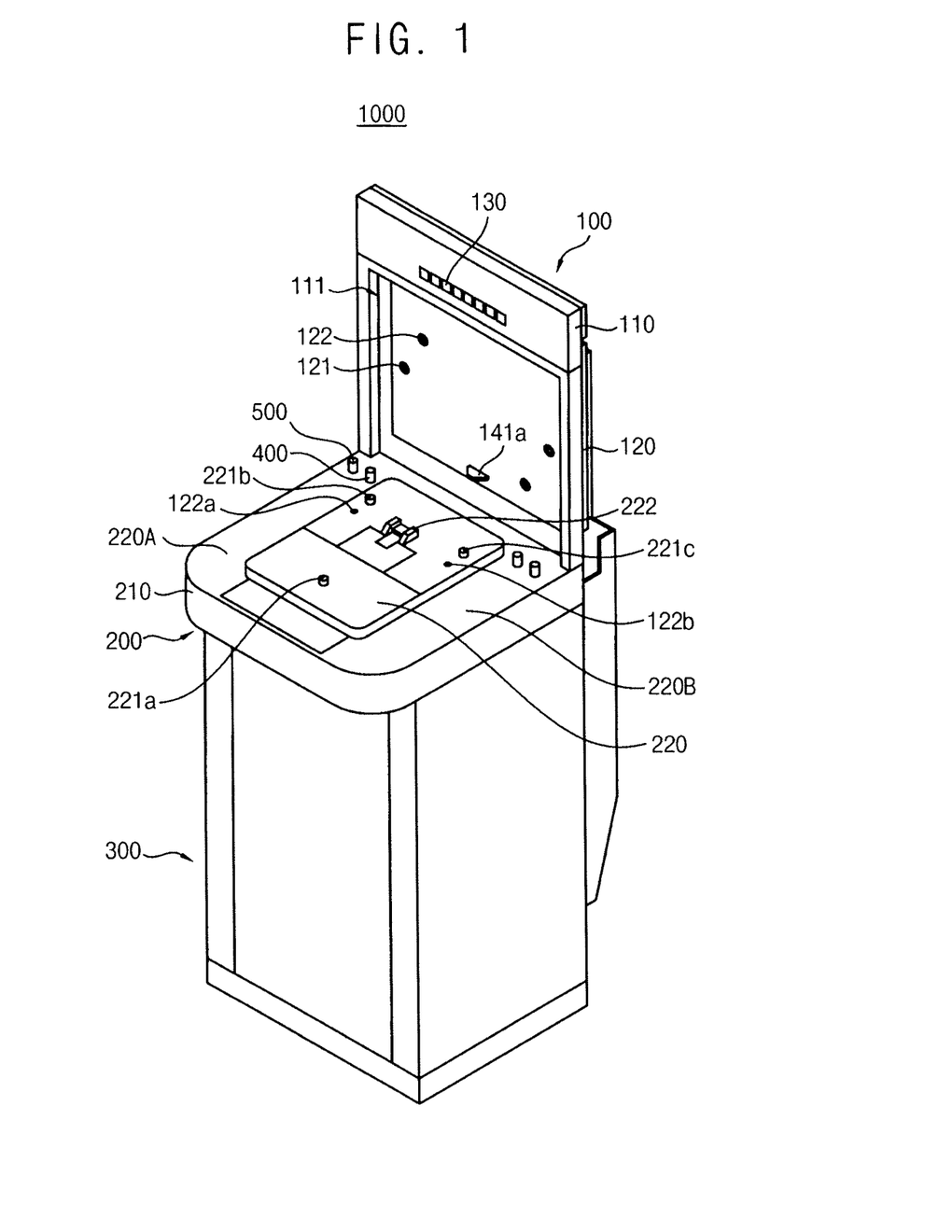
FIG. 1 illustrates an embodiment of a load port module for a substrate processing apparatus.
Figure 2A:
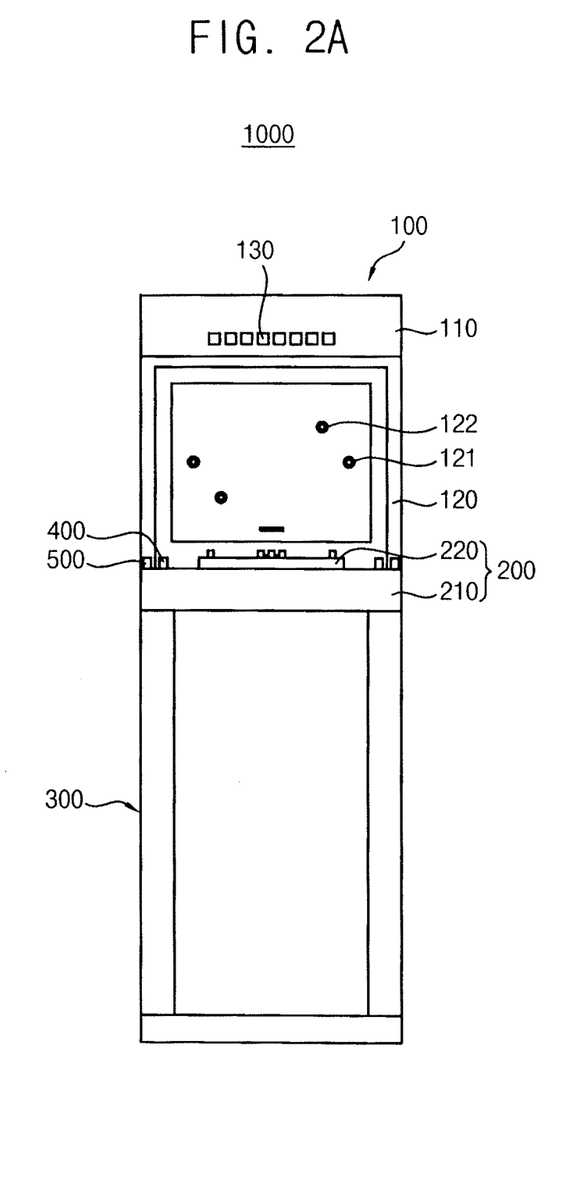
FIG. 2A illustrates a front view of the load port module.
Figure 2B:
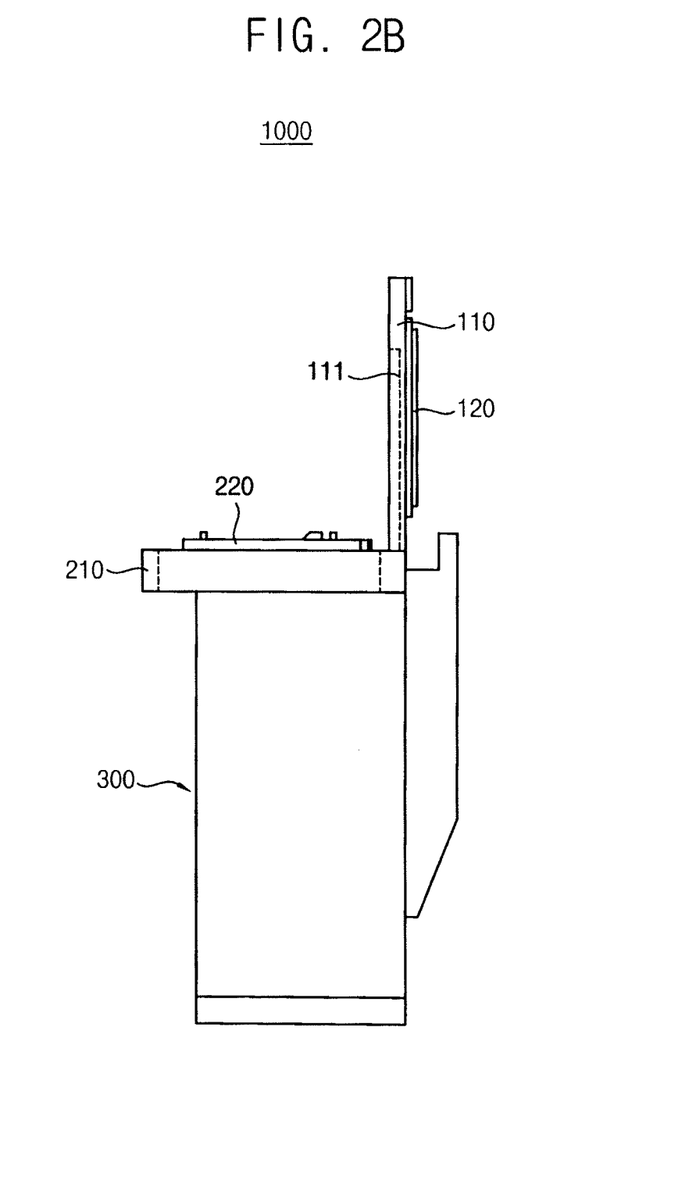
FIG. 2B illustrates a side view of the load port module.
Figure 3:
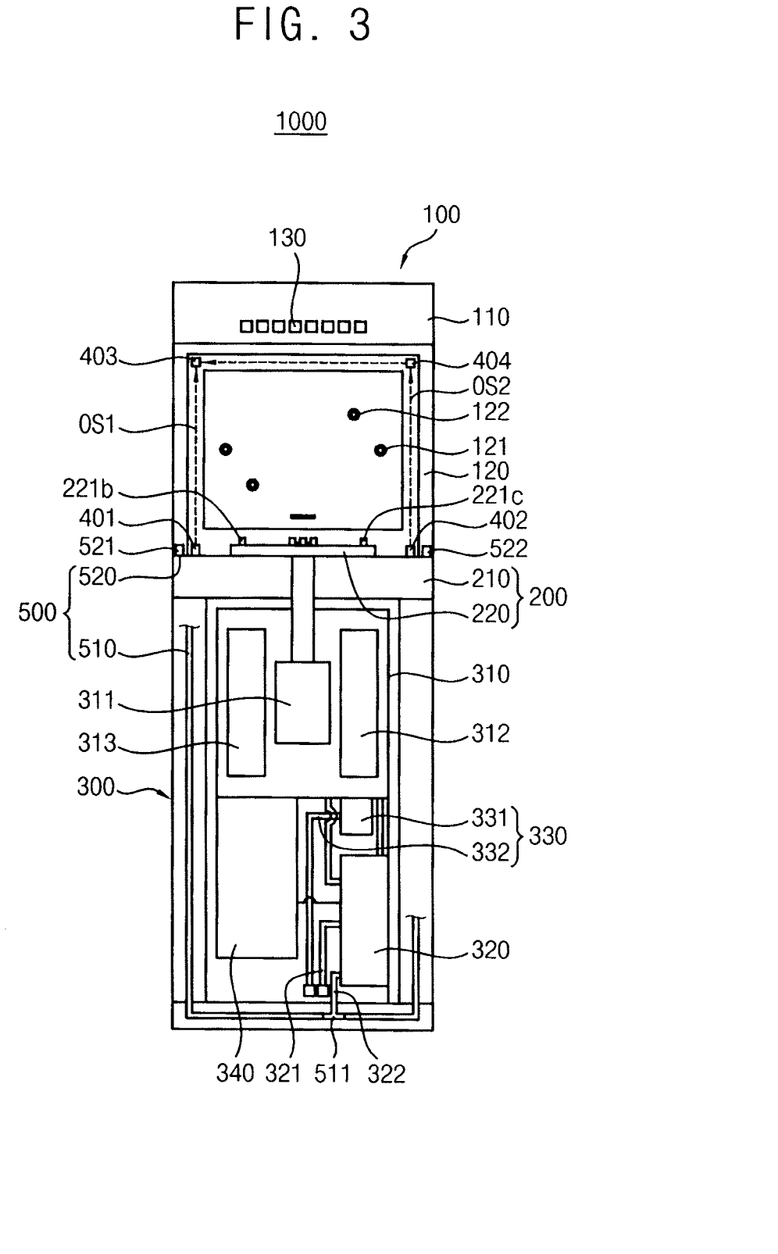
FIG. 3 illustrates an example of a driver of the load port module.

In an example embodiment, driver 300 may include moving unit 310 for moving the moving plate 220 and opener 120, a pneumatic regulator 320 for controlling compressed air supplied to or discharged from moving unit 310, a vacuum controller 330 for applying vacuum pressure to absorption pad 122. A control unit 340 may be connected to and control operation of moving unit 310, pneumatic regulator 320, and vacuum controller 330 according to a position of substrate cassette 10 and a joint of opener 120 and door 12. Also, control unit 340 may be connected to and control operation of safety sensor 400 and may stop operation of moving plate 220 and opener 120 according to stop signal(s) of safety sensor 400.

For example, moving unit 310 may include a first actuator 311 for moving the moving plate 220 and a second actuator 312 for moving the opener 120 in a vertical direction along the vertical frame 100. The first actuator 311 may move moving plate 220 in a horizontal direction on fixed plate 210, and thus door 12 of substrate cassette 10 may be combined with opener 120. When door 12 and opener 120 are combined, the second actuator 312 may move opener 120 downwards in the vertical direction. Thus, door 12 may be separated from body 11 of substrate cassette 10. Therefore, inner space S of substrate cassette 10 may be opened toward the inside of the substrate transfer module. A third actuator 313 may be provided in driver 300. The third actuator 330 may operate a mapping unit for detecting accurate positions of the substrates in substrate cassette 10.

Particularly, first actuator 311 may move moving plate 220 horizontally in a first direction forward to vertical frame 100 or in a second direction backward from vertical frame 100. As a result, substrate cassette 10 may move forward to or backward from vertical frame 100 by first actuator 311. The second actuator 312 may move the side bar upwards or downwards along vertical frame 100. Thus, opener 120 combined to the side bar may move downwards or upwards by second actuator 312.

That is, substrate cassette 10 may be combined with or separated from opener 120 by horizontal movement of the moving plate as operated by first actuator 311. The opening 111 of front sidewall 110 may be closed or opened by vertical movement of actuator 120 operated by second actuator 312.

The moving unit 310, including the first to third actuators 311 to 313, may be operated by a pneumatic operator that may generate linear motion using compressed air.

Figure 5:
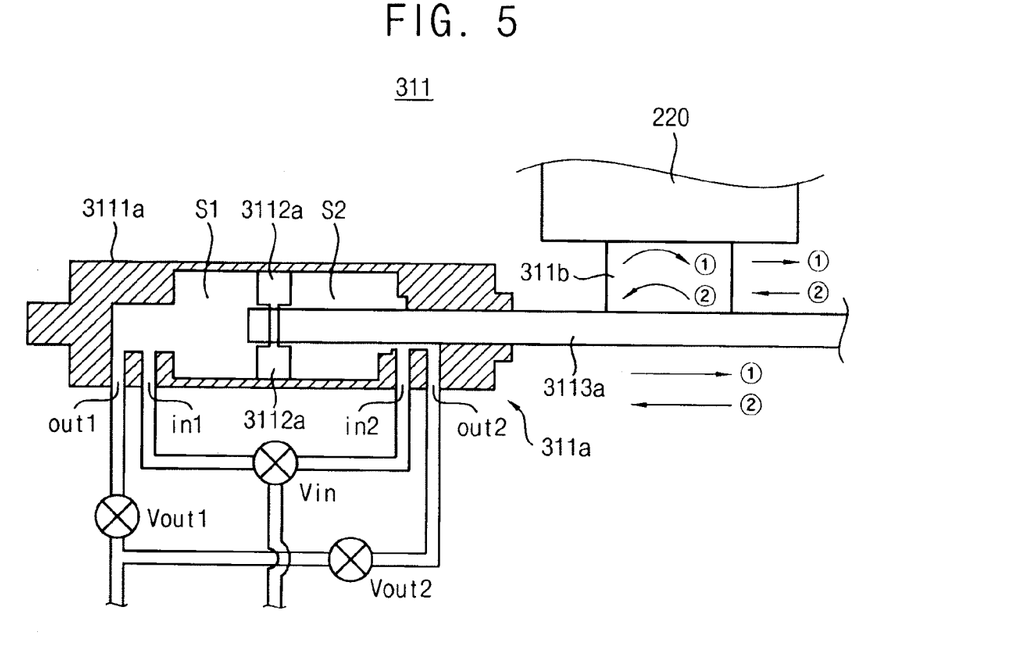
FIG. 5 illustrates an embodiment of a first actuator for moving a plate.

FIG. 5 illustrates an embodiment of first actuator 311 for moving moving plate 220. Referring to FIG. 5, first actuator 311 may include a pneumatic operator 311a for generating linear motion using pneumatic air and a motion transfer 311b for transferring the linear motion to moving plate 220. The motion transfer 311b may closely contact a rear surface of moving plate 220, and thus moving plate 220 may move according to motion of motion transfer 311b.

The pneumatic operator 311a may include a cylinder 3111a through which the compressed air may flow, a piston 3112a reciprocating in cylinder 3111a according to the compressed air, and a piston rod 3113a connected to piston 3112a and extending to an exterior of cylinder 3111a. An inner space of cylinder 3111a may include a first space S1 and a second space S2 which are divided by piston 3112a. The compressed air may be individually supplied to first and second spaces S1 and S2. Thus, pneumatic operator 311a may be configured as a double-acting cylinder structure. However, the pneumatic operator 311a may be configured as a single-acting cylinder structure or another type of structure.

When the compressed air is supplied to first space S1 through a first inlet in1, piston 3112a may move in the first direction (①). As a result, air in second space S2 may be discharged out to the surroundings through a second outlet out2. Conversely, when compressed air is supplied to second space S2 through second inlet in2, piston 3112a may move in the second direction (②). As a result, air in first space S1 may be discharged out to the surroundings through a first outlet out1. The compressed air may be selectively supplied to one of the first or second spaces S1 and S2 by an input control valve Vin.

Further, the compressed air may be selectively discharged from the cylinder 3111a through one of first or second output control valves Vout1 and Vout2. The first and second output control valves Vout1 and Vout2 may be linked with input control valve Vin. Thus, the discharge path of the compressed air may be selected according to the input direction of the compressed air. In the present example embodiment, input control valve Vin and first and second output control valves Vout1 and Vout2 may include a solenoid valve, in which a flow path of the compressed air may be changed by electrical signals.

The piston rod 3113a may move in one of the first or second directions according to movement of piston 3112a. The motion transfer 311b contacting the moving plate 220 may be connected to an end portion of piston rod 3113a. In the present example embodiment, a driving rack may be provided at an end portion of piston rod 3113a. The motion transfer 311b may include a pinion corresponding to the driving rack. In addition, a driven rack corresponding to the pinion may be provided at the bottom of moving plate 220. Therefore, pneumatic operator 311a may move moving plate 220 by operation of the rack and pinion. While the present example embodiment discloses that moving plate 220 may be moved by the rack and pinion, different types of power transmitting mechanisms may be used in other embodiments for moving plate 220 instead of the pair of the rack pinion.

The second and third actuators 312 and 313 may have substantially the same structure as the first actuator 311, except that the second and third actuators 312 and 313 may move upwards and downwards in the vertical direction instead of the horizontal direction. In other embodiments, second and the third actuators 312 and 313 may have structures different from first actuator 311.

The pneumatic regulator 320 may supply compressed air to first through third actuators 311, 312 and 313 and may discharge the compressed air from the first through third actuators 311, 312 and 313 to surroundings. Air may be provided to pneumatic regulator 320 from an air source via an air supply tube 321. The air may be pressurized to a sufficient or predetermined pressure in pneumatic regulator 320. Then, the compressed air may be supplied to first to third actuators 311 to 313. In addition, the compressed air discharged from first and second spaces S1 and S2 may first be gathered in pneumatic regulator 320, and then may be discharged to surroundings from pneumatic regulator 320 out of housing 301. The pneumatic regulator 320 may include various parts or means for increasing the air pressure.

While the present example embodiment discloses that moving unit 310 may be moved by pneumatic regulator 320 and pneumatic operator 311a, moving unit 310 may be moved by a different mechanism in other embodiments. An example of such a different mechanism includes a hydraulic pressure regulator and a hydraulic operator which are controlled, for example, in view of operational characteristics and conditions of load port module 1000.

The vacuum controller 330 may apply vacuum pressure to absorption pad 122, and door 12 of substrate cassette 10 may be fixed to opener 120 by the vacuum absorption. For example, vacuum controller 330 may include a vacuum pump 331 for applying vacuum pressure to absorption pad 122, and a vacuum line 332 connected to vacuum pump 331 for discharging air from vacuum pump 331.

The control unit 340 may be connected to and control operation of moving unit 310, pneumatic regulator 320, and vacuum controller 330 according to the position of substrate cassette 10 and the joint of opener 120 and door 12. Also, control unit 340 may be connected to and control operation of safety sensor 400 and may stop operation of moving plate 220 and opener 120 according to one or more stop signals from safety sensor 400.

When moving plate 220 is to move toward vertical frame 100 in the first direction, control unit 340 may control input control valve Vin in such a way that compressed air is supplied to first space S1 of cylinder 3111a. The control unit 340 may control second output control valves Vout2 to be open and first output control valves Vout1 to be closed, in such a way that air in second space S2 may be discharged.

When moving plate 220 is to move backward from vertical frame 100 in the second direction, control unit 340 may control input control valve Vin in such a way that compressed air may be supplied to second space S2 of cylinder 3111a. The control unit 340 may control second output control valves Vout2 to be closed and first output control valves Vout1 to be open in such a way that air in first space S1 may be discharged.

A docking signal indicating that door 12 and opener 120 are combined or docked with each other may be detected by control unit 340. When the docking signal is detected, control unit 340 may control second actuator 312 to move downward along front sidewall 110 together with door 12. Thus, door 12 may be separated from substrate cassette 10 and inner space S of substrate cassette 10 may be open to communicate with the inside of the substrate transfer module such as the EEFM.

Further, control unit 340 may be connected to safety sensor 400, and one or more stop signals generated from safety sensor 400 may be transferred to control unit 340. When the stop signal(s) are transferred to the control unit 340, the control signal may control moving unit 310 to stop, and thus moving plate 220 and opener 120 may be stopped.

The safety sensor 400 may be provided around stage 200, and thus foreign matter around opening 111 of front sidewall 110 may be detected in moving substrate cassette 10 toward front sidewall 110. Various sensors may be provided on or over stage 200 for detecting the positions of substrate cassette 10 and load port module 1000. For example, a presence and placement sensor may be arranged on and/or over stage 200 and may provide information indicative of whether substrate cassette 10 is correctly positioned on moving plate 220.

A docking sensor may be arranged on and/or over stage 200 and may provide information indicative of whether latch key 121 and absorption pad 122 are combined with door 12 of substrate cassette 10. The information generated from the above-mentioned sensors may be visually displayed by display unit 130. In one embodiment, safety sensor 400 may be arranged on fixed plate 210 and front sidewall 110 around opening 111. When foreign matter (e.g., contaminants and/or other types of particles) are detected in advance by safety sensor 400, moving unit 310 may be controlled to be stopped.

In the present example embodiment, safety sensor 400 may include one or more optical sensors for detecting the foreign matter. Detection may be achieved, for example, based on whether or not optical signal(s) are transferred by the optical sensor(s).

The sensor cleaner 500 may be arranged around safety sensor 400 for automatically removing foreign matter from safety sensor 400, thereby preventing generation of stop signals for stopping moving unit 310 due to the foreign matter.

When foreign matter is on stage 200 around opening 111, operation of load port module 1000 may be stopped or halted to prevent the foreign matter from being introduced into the EFEM. In such a case, safety sensor 400 may generate one or more stop signals for transfer to control unit 340. Then, control unit 340 may control moving unit 310 to stop, thereby stopping operation of moving plate 220 and opener 120. The moving unit 310 may be maintained in a stop state until the foreign matter is removed from stage 200.

As indicated, sensor cleaner 500 may be arranged around safety sensor 400. In one embodiment, sensor cleaner 500 is operated simultaneously with movement of moving plate 220. Thus, foreign matter may be automatically removed from safety sensor 400 when moving plate 220 moves on fixed plate 210. When a plurality of particles correspond to the foreign matter in mounting substrate cassette 10 onto moving plate 220 and the particles are distributed around safety sensor 400 on fixed plate 210, sensor cleaner 500 may remove the particles automatically based on movement of moving plate 220 toward front sidewall 110. Thus, no stopping signals are generated by safety sensor 400 under these conditions. Accordingly, load port module 1000 may be prevented from being automatically stopped due to the foreign matter or particles generated when the substrate cassette is mounted onto load port module 1000.

In the present example embodiment, safety sensor 400 may include an optical sensor. Also, sensor cleaner 500 may include a guide tube 510 for guiding compressed air to safety sensor 400 from moving unit 310. A nozzle 520 may be connected to an end portion of guide tube 510 for injecting the compressed air to safety sensor 400.

For example, safety sensor 400 may include a perimeter sensor having a first light emitter 401, a second light emitter 402, a light receiver 403, and a reflector 404. The first light emitter 401 may be positioned on fixed plate 210 adjacent to a first side portion 220A of moving plate 220. The first light emitter 401 may generate a first optical signal OS1. The second light emitter 402 may be positioned on fixed plate 210 adjacent to a second side portion 220B opposite to first side portion 200A of moving plate 220. The second light emitter 402 may generate a second optical signal OS2.

The light receiver 403 may be positioned on vertical frame 100 along a path of first optical signal OS1. Thus, first optical signal OS1 may reach light receiver 403 directly from first light emitter 401.

The reflector 404 may be positioned on vertical frame 100 along a path of second optical signal OS2 and may face light receiver 403. Thus, second optical signal OS2 may reach reflector 404 from second light emitter 402, and then may be reflected from reflector 404 to light receiver 403. That is, second optical signal OS2 may indirectly reach light receiver 403 via reflector 404.

The first and the second light emitters 401 and 402 may be positioned around first and the second side portions 220A and 220B, and thus may be arranged in opposing relation to each other along a width of moving plate 220. Thus, foreign matter on first and the second side portions 220A and 220B of moving plate 220 may be detected individually.

In the present example embodiment, when both of the first and the second optical signals OS1 and OS2 reach light receiver 403, no foreign matter may be positioned on first and second light emitters 401 and 402. That is, no foreign matter may be distributed at the first and the second side portions of moving plate 220 around opening 111. Thus, no stopping signals may be generated by safety sensor 400 under these conditions.

When both of first and the second optical signals OS1 and OS2 reach light receiver 403, safety sensor 400 may determine that stage 200 may be in a normal state. In contrast, when at least one of first or second optical signals OS1 and OS2 do not reach light receiver 403, at least one of the first or second light emitters 401 and 402 may be covered with foreign matter. That is, foreign matter may be distributed on at least one of the first or second side portions 220A and 220B of moving plate 220 around opening 110. Thus, one or more stopping signals may be generated by safety sensor 400.

When at least one of the first or second optical signals OS1 and OS2 do not reach light receiver 403, safety sensor 400 may determine that stage 200 may be in an abnormal state. The light receiver 404 may include an optical controller for generating control signals indicating a state of the stage. When the stage is in an abnormal state, an abnormal signal may be transferred to control unit 340 from light receiver 404 and moving unit 310 may be controlled to stop. In contrast, when the stage is in a normal state, a normal signal may be transferred to control unit 340 from light receiver 404 and moving unit 310 may be operated without any interrupts caused by foreign matter.

Therefore, moving plate 220 and opener 120 may be stopped when stage 200 is in an abnormal state. That is, when foreign matter may be detected on stage 200 around opening 111 of vertical frame 100, moving unit 310 may be automatically stopped and, thus, moving plate 210 and opener 120 may be stopped. That is, load port module 1000 may be stopped by foreign matter detected on stage 200.

However, foreign matter on the first and the second light emitters 401 and 402 may be automatically removed by sensor cleaner 500 when the foreign matter is detected. For example, compressed air may be directed onto first and the second light emitters 401 and 402 of safety sensor 400 through nozzles 520.

In one embodiment, nozzle 520 includes first and second lower nozzles 521 and 522 for directing compressed air to first and second light emitters 521 and 522. The first lower nozzle 521 may be positioned near first light emitter 401, and thus foreign matter on first light emitter 401 may be removed from stage 200 by compressed air. Thus, first optical signal OS1 may reach light receiver 403.

Similarly, second lower nozzle 522 may be positioned near second light emitter 402, and thus foreign matter on second light emitter 402 may be removed from stage 200 by compressed air. Thus, second optical signal OS2 may reach reflector 404 and, then, may be reflected to light receiver 404.

Accordingly, foreign matter may be removed from respective first and second side portions 220A and 220B of moving plate 220. Thus, first and the second optical signals OS1 and OS2 may reach light receiver 403. The safety sensor 400 may determine that stage 200 may be in a normal state, and thus stopping load port module 1000 as a result of foreign matter may be minimized.

The compressed air may be guided to nozzle 520 through guide tube 510. The air discharged from moving unit 310 may flow into pneumatic regulator 320 and may be pressurized to a predetermined pressure. Then, the compressed air may be guided to nozzle 520 through guide tube 510. For example, guide tube 510 may include a flexible tube.

Figure 6:
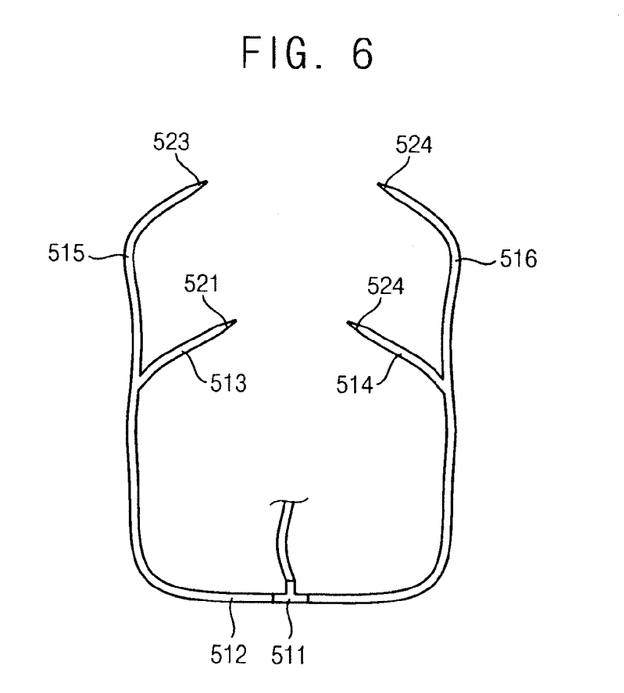
FIG. 6 illustrates an embodiment of a guide tube of the sensor cleaner in FIG. 3.

FIG. 6 illustrates an example of the guide tube of the sensor cleaner 500 in FIG. 3. Referring to FIG. 6, guide tube 510 may include a connector 511 connected to a discharge tube 322 of pneumatic regulator 320, a tube body 512 connected to connector 511, a first branch 513 diverging to first light emitter 401 from tube body 512, and a second branch 514 diverging to second light emitter 402 from tube body 512. The first and second lower nozzles 521 and 522 may be coupled to first and second branches 513 and 514, respectively.

In one embodiment, connector 511 includes a T-type joint. Thus, compressed air may be simultaneously guided to both of first and the second side portions 220A and 220B. According to one example, the T-type joint and flexible tube may have a diameter of about 6 mm and compressed air may be discharged from discharge tube 322 to connector 511 at a pressure of about 0.45 MPa. In other embodiments, different diameters and/or pressures may be used.

The first and the second lower nozzles 521 and 522 may direct compressed air to fixed plate 210 around first and the second light emitters 401 and 402. In the present example embodiment, pneumatic regulator 320 may be arranged under stage 200, The first and second lower nozzles 521 and 522 may be arranged on stage 200. Thus, tube body 512 may extend upwards along a sidewall of housing 301.

The nozzle may further include a first upper nozzle 523 for directing compressed air to light receiver 403 and a second upper nozzle 524 for directing compressed air to reflector 404.

When at least one of light receiver 403 or reflector 404 has foreign matter, at least one of the first or second optical signals OS1 and OS2 may not reach light receiver 404, thereby generating one or more of the stopping signals. In such a case, the foreign matter on light receiver 403 may be removed by first upper nozzle 523, and foreign matter on reflector 404 may be removed by second upper nozzle 524. The first and second optical signals OS1 and OS2 may reach light receiver 403.

For example, guide tube 510 may include a third branch 515 diverging to light receiver 403 from tube body 512 and a fourth branch 516 diverging to reflector 404 from tube body 512. The first and the second upper nozzles 523 and 524 may be coupled to third and fourth branches 515 and 516, respectively. The third branch 515 may be connected with first branch 513 and tube body 512, and may be positioned at a first side portion of front sidewall 110 at which light receiver 403 may be positioned. Thus, compressed air may be guided to first upper nozzle 523 by third branch 515 and be directed to light receiver 403. The fourth branch 516 may be connected to second branch 514 and tube body 512, and may be positioned at a second side portion of front sidewall 110 at which reflector 404 may be positioned. Thus, compressed air may be guided to second upper nozzle 524 by third branch 515 and be directed to reflector 404.

Since compressed air directed from sensor cleaner 500 may be supplied from moving unit 310, the injection of compressed air to safety sensor 400 may be performed simultaneously or may otherwise be synchronized with movement of moving unit 310. Thus, foreign matter on and/or around safety sensor 400 may be automatically removed from the load port module, particularly around opening 111 of front sidewall 110. Accordingly, no foreign matter may be distributed on stage 200 and around opening 111 of front sidewall 110. Thus, stopping the load port module caused by foreign matter may be prevented, resulting in an increase in the operational efficiency of the load port module.

According to an example embodiment of the load port module, foreign matter on and/or around the safety sensor, which may be positioned on the stage and the front sidewall around the opening of the vertical frame, may be automatically removed by using air discharged from the moving unit. Thus, no foreign matter may be distributed on the stage and front sidewall 110 around opening 111. Thus, stopping the load port module caused by foreign matter may be prevented, resulting in an increase in the operational efficiency of the load port module.

Figure 7:
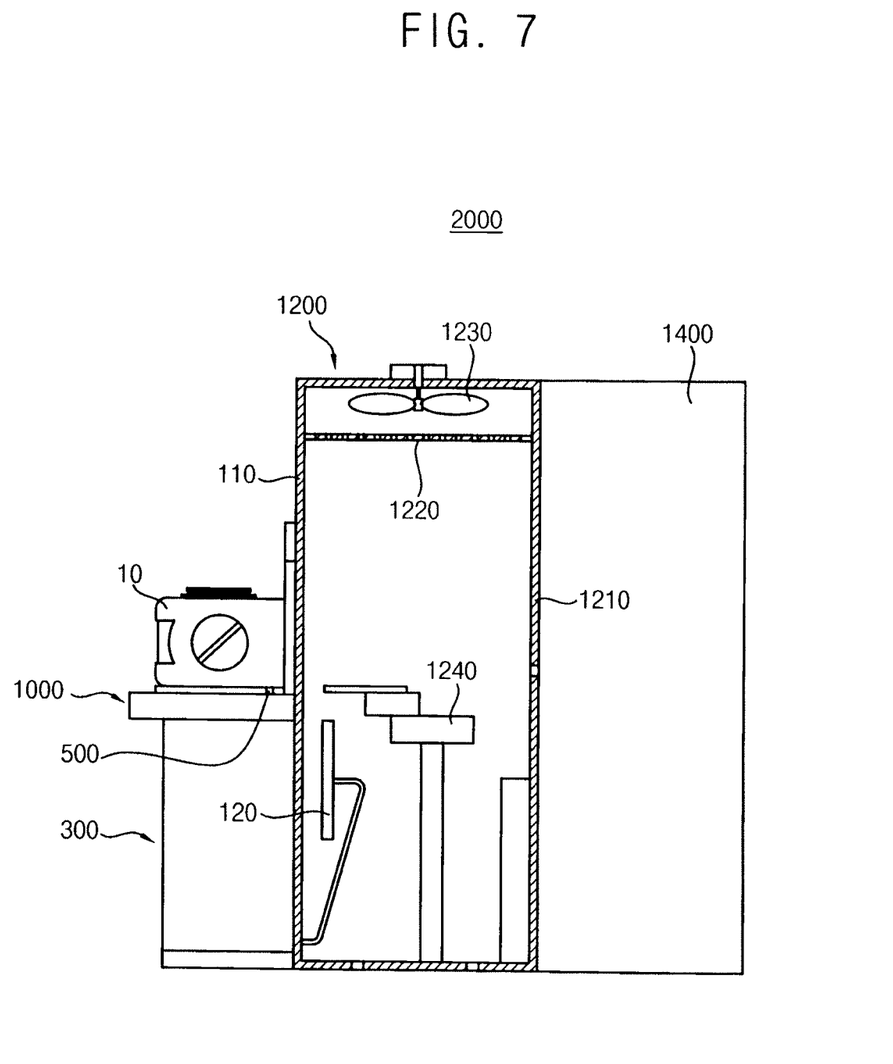
FIG. 7 illustrates an example of a processing apparatus which include the load port module in FIG. 1.

FIG. 7 illustrates an embodiment of a processing apparatus 2000 which includes a load port module. In this embodiment, the processing apparatus may be a semiconductor manufacturing apparatus. However, other embodiments including the load port module may correspond to different types of processing apparatuses. For example, the processing apparatus may include an apparatus in which glass substrates may be processed for manufacturing a liquid crystal display (LCD) device. The load port module may be according to any of the aforementioned embodiments.

Referring to FIG. 7, processing apparatus 2000 includes a load port module 1000 on which substrate cassette 10 such as a FOUP may be mounted and a process chamber 1400 in which a substrate may be processed. The processing apparatus 2000 may also include an interface module 1200 (such as an EFEM) interposed between the substrate cassette and process chamber 1400, for extracting the substrate from substrate cassette 10 and loading the substrate into process chamber 1400.

A plurality of substrates may be stacked in substrate cassette 10, and substrate cassette 10 may be transferred and mounted onto load port module 1000 by a cassette transfer. The cassette transfer may be, for example, an overhead transfer (OHT), an overhead conveyer (OHC), or an automatic guided vehicle (AGV). Then, substrate cassette 10 may move toward front sidewall 110 and, thus, may be combined with opener 120. The load port module 1000 may have a structure similar to FIGS. 1 to 3.

The substrate cassette 10 may move moving plate 220, and thus door 12 of substrate cassette 10 may be combined with opener 120 of vertical frame 100. The moving plate 220 may be operated using compressed air controlled by pneumatic operator 311a. The air discharged from moving plate 220 may flow into and be pressurized by pneumatic regulator 320. Then, compressed air may be directed to safety sensor 400 by sensor cleaner 500, thereby removing foreign matter from stage 200 and vertical frame 100 around opening 111 of vertical frame 100. Particularly, compressed air may be directed to safety sensor 400 at or near a same time when moving plate 220 is operated. Thus, load port module 1000 may be prevented from being stopped by the detection of foreign matter that may be generated during a process of mounting substrate cassette 10 onto moving plate 220.

When door 12 of substrate cassette 10 and opener 120 of vertical frame 100 are combined with each other, opener 120 may move downward along vertical frame 100 together with door 12 by the side bar, which may be operated by second actuator 312. Thus, substrate cassette 10 may be open toward the inside of interface module 1200.

The interface module 1200 may include a closed space defined by front sidewall 110, a rear sidewall 1210 opposite to front sidewall 110, and a top and a bottom. The rear sidewall 1210 may be near or adjacent process chamber 1400. The substrate may be provided into interface module 1200 through opening 111 and may be loaded to process chamber 1400 through a gate from interface module 1200. A substrate transfer 1240 may be provided in interface module 1200. The substrate may be extracted from substrate cassette 10 and may be loaded into process chamber 1400 by substrate transfer 1240.

The substrate transfer 1240 may include a robot arm for transferring the substrate and a controller for controlling the robot arm. In a modified example embodiment, a plurality of substrate transfers 1240 may be arranged in interface module 1200. As a result, a plurality of substrates may be simultaneously extracted from substrate cassette 10 and loaded into process chamber 1400. A mapping sensor may be arranged on front sidewall 110 around opening 111. The positions of the substrates in substrate cassette 10 may be detected, for example, by the mapping sensor.

An air circulator may be provided at an upper portion of interface module 1200. Foreign matter in interface module 1200 may be removed by the air circulator, so that the cleanliness of interface module 1200 may be sufficiently controlled. For example, a ventilation area defined by a filter 1220 may be provided at an upper portion of interface module 1200 and a rotary fan 1230 may be installed in the ventilation area. Cleaning air may be provided from rotary fan 1230 and may be filtered by filter 1220. Thereafter, the cleaning air may be provided to a transfer area under the ventilation area, and foreign matter in the transfer area may be removed by the flow of the cleaning air. Then, cleaning air may be discharged from the transfer area of interface module 1200 (through a discharge hole of the bottom) with the foreign matter. The substrate extracted from substrate cassette 10 may be loaded into process chamber 1400 through the gate of rear sidewall 1210.

According to an example embodiment of the processing apparatus, when the substrate cassette is mounted on the load port module and combined with interface module 1200, foreign matter on safety sensor 400 may be automatically removed simultaneously when substrate cassette 10 moves toward interface module 1200. Thus, no foreign matter may be distributed on stage 200 and front sidewall 110 around opening 111. Thus, stopping load port module 1000 as a result of foreign matter may be sufficiently prevented, resulting in an increase in the operational efficiency of load port module 1000.

Although foreign matter may be generated when substrate cassette 10 is mounted onto load port module 1000 and distributed on stage 200, the foreign matter may be automatically removed from stage 200 at a same time when substrate cassette 10 is operated. Accordingly, stopping load port module 1000 caused by foreign matter may be prevented, resulting in an increase in the overall operational efficiency of the processing apparatus.

Figure 8:
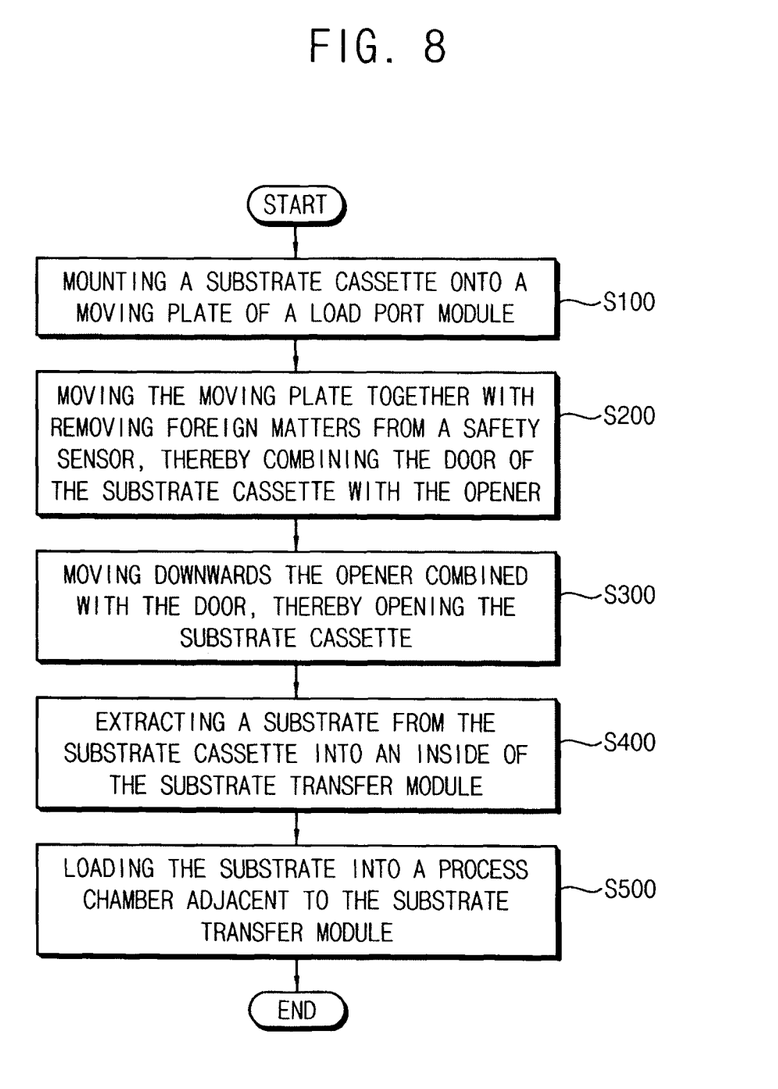
FIG. 8 illustrates operations included in an embodiment of a method for loading a substrate in the processing apparatus in FIG. 7.

FIG. 8 illustrates an embodiment of a method for loading a substrate in the processing apparatus in FIG. 7. The processing apparatus may include the load port module in FIG. 1.

Referring to FIGS. 1 to 4, 7, and 8, the substrate may be mounted on moving plate 220 of stage 200 of load port module 1000 (operation S100). The stage 200 including fixed plate 210 and moving plate 220 may extend outwardly from vertical frame 100 of load port module 1000. Particularly, fixed plate 210 may extend from vertical frame 100 and moving plate 220 may be movably arranged on fixed plate 210.

The substrates may be stacked in substrate cassette 10 (such as the FOUP) and substrate cassette 10 may be mounted onto moving plate 220 by the substrate transfer, such as the OHT, the OHC and the AGV.

For example, when a predetermined process is completed with respect to the substrate, the substrates may be stacked in the FOUP. Then, the FOUP may be transferred to another process apparatus for performance of a next process. Therefore, the FOUP may be transferred and mounted onto the load port module of the process apparatus for the next process. When the FOUP is mounted onto the load port module, a plurality of particles (or generically, foreign matter) may be generated due to mechanical collision and friction between the FOUP and load port module. Thus, the particles may be distributed on stage 200 of load port module 1000. Particularly, the FOUP may be mounted onto moving plate 220 on fixed plate 210 of stage 200.

The moving plate 220 may move toward vertical frame 100 along fixed plate 210. Thus, door 12 of the FOUP may be combined with opener 120 of vertical frame 100, together with the removal of the particles from safety sensor 400 (operation S200).

When the FOUP may be correctly positioned on moving plate 220, moving unit 310 may be operated by pneumatic operator 311a. Thus, moving plate 220 may move toward vertical frame 100, until door 12 of the FOUP may be combined with opener 120 of vertical frame 100. For example, pneumatic operator 311a may include a double-acting pneumatic cylinder structure and, thus, moving plate 220 may be moved by the compressed air. Since pneumatic operator 311a may be configured into the double-acting cylinder structure, air may be discharged from the cylinder regardless of the moving direction of moving plate 220.

The air discharged from the cylinder of pneumatic operator 311a may flow into pneumatic regulator 320 and may be pressurized. Then, compressed air may be supplied to sensor cleaner 500 from pneumatic regulator 320. That is, the compressed air may be guided upwards on fixed plate 210 through guide tube 510, and then may be directed onto safety sensor 400 through injection nozzle 520. That is, the compressed air may be directed to safety sensor 400 simultaneously when moving plate 220 may move toward vertical frame 100. Therefore, foreign matter on and/or around safety sensor 400 may be removed by the compressed air, that may be directed simultaneously with movement of moving plate 220. Accordingly, stopping the FOUP may be prevented by foreign matter.

In the present example embodiment, sensor cleaner 500 may include an optical sensor. For example, safety sensor 400 may include a first light emitter 401, a second light emitter 402, a light receiver 403, and a reflector 404. The first light emitter 401 may be positioned on fixed plate 210 adjacent to a first side portion 220A of moving plate 220 and may generate a first optical signal OS1. The second light emitter 402 may be positioned on fixed plate 210 adjacent to a second side portion 220B opposite to first side portion 200A of moving plate 220, and may generate a second optical signal OS2. The light receiver 403 may be positioned on vertical frame 100 along a path of the first optical signal OS1. Thus, the first optical signal OS1 may reach light receiver 403 directly from first light emitter 401.

The reflector 404 may be positioned on vertical frame 100 along a path of the second optical signal OS2 and may face light receiver 403. Thus, the second optical signal OS2 may reach reflector 404 from second light emitter 402, and then may be reflected from reflector 404 to light receiver 403. That is, second optical signal OS2 may indirectly reach light receiver 403 via reflector 404.

When at least one of first or second optical signals OS1 and OS2 do not reach light receiver 403, at least one of first or second light emitters 401 and 402 may be covered with foreign matter. That is, foreign matter may be distributed on at least one of first or second side portions 220A and 220B of moving plate 220 around opening 111. As a result, one or more stopping signals may be generated by safety sensor 400.

However, foreign matter on first and second light emitters 401 and 402 may be automatically removed by sensor cleaner 500 when the foreign matter is detected. For example, compressed air may be directed onto first and the second light emitters 401 and 402 of safety sensor 400. Accordingly, the FOUP may be prevented from being stopped by the foreign matter.

In addition, compressed air may be directed to light receiver 403 and reflector 404. For example, compressed air may be directed to first and second light emitters 401 and 402 through first and second lower nozzles 521 and 522, and may be directed to light receiver 403 and reflector 404 through first and second upper nozzles 523 and 524. Thus, foreign matter on light receiver 403 and reflector 404 may be sufficiently removed, and thus first and the second optical signals OS1 and OS2 may reach light receiver 403.

Then, opener 120 combined with door 12 of the FOUP may be moved downward along vertical frame 100, and thus door 12 may be separated from the FOUP and the FOUP may be open (operation S300). When door 12 is correctly combined with opener 120, a docking signal may be transferred to control unit 340. The control unit 340 may then control second actuator 312 to tilt and move opener 120 downward together with door 12. Accordingly, inner space S of the FOUP may communicate with the inside of interface module 1200. The interface module may include an equipment front end module (EEFM).

Then, the substrate may be extracted from the FOUP into the inside of interface module 1200 by substrate transfer 1240 (operation S400).

The positions of the substrates in the FOUP may be detected by the mapping sensor, and the substrate transfer may extract the substrate based on the detected substrate positions. For example, substrate transfer 1240 may include a robot arm that may be movable in three-axis in the interface module 1200.

Then, the substrate may be loaded into process chamber 1400 adjacent to interface module 1200 through the gate of rear sidewall 1210 (operation S500). An expected process may be performed on the substrate in the process chamber.

When the expected process is completed, the substrate may be re-stacked in the FOUP again. When the substrates may be fully stacked in the FOUP, door 12 may be coupled to body 11 of the FOUP and inner space S of the FOUP may be sealed off from the surroundings. Thereafter, opener 120 may move upwards along vertical frame 100 and close opening 111 of front sidewall 111. The door 12 may be separated from opener 120 and moving plate 220 may move backwards from front sidewall 110 to the mounting position of the FOUP on load port module 1000.

The backward movement of moving unit 310 may also be performed by pneumatic operator 311a. Thus, compressed air may also be directed to safety sensor 400 through nozzles 520 of sensor cleaner 500, thereby sufficiently removing foreign matter from safety sensor 400 when moving plate 220 moves backwards. Accordingly, stopping of load port module 1000 caused by the foreign matter moving backwards may be sufficiently prevented, resulting in an increase in the operational efficiency of load port module 1000.

According to example embodiments of the load port module and the processing apparatus having the same, foreign matter on and/or around the safety sensor may be automatically removed from the stage and/or the vertical frame of the load port module. This may occur, for example, when initiating movement of the substrate cassette forward or backward with respect to the interface module.

Therefore, movement of the substrate cassette may be prevented from being stopped by the foreign matter. Particularly, although particles may be generated when the substrate cassette is mounted onto the load port module, and thus particles may be distributed on the stage of the load port module, the particles may be automatically removed from the stage at a same time when the substrate cassette moves toward or backward from the interface module. Accordingly, stopping the load port module caused by the particles may be prevented, to thereby increase the overall operational efficiency of the processing apparatus.

The present example embodiments of the load port module may be applied to various apparatuses for processing substrates, including but not limited to semiconductor manufacturing apparatuses and LCD manufacturing apparatuses.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A load port module, comprising:
   a vertical frame having an opening to be closed by an opener for opening a door of a substrate cassette including a plurality of stacked substrates;
   a stage having a fixed plate that extends outwardly from the vertical frame, and a moving plate movably arranged on the fixed plate to support the substrate cassette;

a driver under the stage and having a mover to drive the moving plate and opener;

a safety sensor on at least one of the vertical frame or the stage around the opening, the safety sensor to generate a stop signal to stop the mover when foreign matter is detected around the opening; and a sensor cleaner connected to the driver to automatically remove the foreign matter when the moving plate moves, the mover continuing to operate after detection of the foreign matter by the safety sensor and removal of the foreign matter by the sensor cleaner.

2. The module as claimed in claim 1, wherein:

the safety sensor includes an optical sensor to generate the stop signal based on an optical signal, the mover includes a pneumatic operator to effect linear motion using first compressed air.

3. The module as claimed in claim 2, wherein the sensor cleaner includes:

a guide tube to guide second compressed air onto the stage, and a nozzle connected to the guide tube to direct the second compressed air to the safety sensor.

4. The module as claimed in claim 3, wherein the optical sensor includes:

a first light emitter, coupled to the fixed plate adjacent to a first side portion of the moving plate, to generate a first optical signal, a second light emitter, coupled to the fixed plate adjacent to a second side portion opposite to the first side portion of the moving plate, to generate a second optical signal, a light receiver, coupled to the vertical frame along a path of the first optical signal, the light receiver to receive the first optical signal directly from the first light emitter, and a reflector coupled to the vertical frame along a path of the second optical signal facing the light receiver, light receiver to receive the second optical signal indirectly via the reflector, wherein the nozzle includes a first lower nozzle through which the second compressed air is directed to the first light emitter and a second lower nozzle through which the second compressed air is directed to the second light emitter.

5. The module as claimed in claim 4, wherein:

the pneumatic operator includes a cylinder through which the first compressed air flows, a piston reciprocating in the cylinder according to the first compressed air, and a piston rod connected to the piston and extending to an exterior of the cylinder; and the guide tube includes a tube body to which the second compressed air is supplied from the driver, a first branch diverging from the tube body and connected to the first lower nozzle, and a second branch diverging from the tube body and connected to the second lower nozzle.

6. The module as claimed in claim 5, wherein:

the nozzle includes a first upper nozzle through which the second compressed air is directed to the light receiver and a second upper nozzle through which the second compressed air is directed to the reflector; and the guide tube further includes a third branch diverging from the tube body and connected to the first upper nozzle and a fourth branch diverging from the tube body and connected to the second upper nozzle.

7. The module as claimed in claim 5, wherein:

the pneumatic operator includes a double-acting pneumatic cylinder, and an inner space of the cylinder includes a first space and a second space, the first compressed air supplied to one of the first or second spaces and air discharged from other one of the first or second spaces.

8. The module as claimed in claim 7, wherein the driver includes a solenoid valve to selectively supply the first compressed air to one of the first and the second spaces of the cylinder.

9. The module as claimed in claim 1, wherein the mover includes:

a first actuator to move the moving plate on the fixed plate in a horizontal direction, and a second actuator to move the opener along the vertical frame in a vertical direction.

10. The module as claimed in claim 9, wherein the driver includes:

a controller connected to the first and the second actuators and the safety sensor, the controller to control the first and second actuators to stop the moving plate and the opener, respectively, according to the stop signal generated from the safety sensor.

\* \* \* \* \*